(12) United States Patent
Kartschoke et al.

(10) Patent No.: US 7,194,714 B2
(45) Date of Patent: Mar. 20, 2007

(54) METHOD OF REDUCING INSTANTANEOUS CURRENT DRAW AND AN INTEGRATED CIRCUIT MADE THEREBY

(75) Inventors: Paul D. Kartschoke, Williston, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 10/605,683

(22) Filed: Oct. 17, 2003

(65) Prior Publication Data

US 2005/0086620 A1    Apr. 21, 2005

(51) Int. Cl.
*G06F 17/50* (2006.01)

(52) U.S. Cl. .................... 716/6; 716/4; 716/5

(58) Field of Classification Search ............... 713/500; 395/500; 364/488, 490; 716/6, 4–5
See application file for complete search history.

(56) References Cited

U.S. PATENT DOCUMENTS

| | | | |
|---|---|---|---|
| 5,258,660 A * | 11/1993 | Nelson et al. .............. 327/141 |
| 5,507,029 A * | 4/1996 | Granato et al. ................. 716/6 |
| 5,508,937 A * | 4/1996 | Abato et al. .................... 716/6 |
| 5,636,372 A * | 6/1997 | Hathaway et al. .......... 713/500 |
| 5,944,834 A * | 8/1999 | Hathaway .................... 713/500 |
| 2003/0014724 A1 * | 1/2003 | Kojima et al. ................ 716/10 |
| 2005/0050496 A1 * | 3/2005 | Kovacs et al. ................. 716/6 |
| 2006/0187001 A1 * | 8/2006 | Pessolano et al. ..... 340/309.16 |

\* cited by examiner

*Primary Examiner*—Paul Dinh
*Assistant Examiner*—Suchin Parihar
(74) *Attorney, Agent, or Firm*—Downs Rachlin Martin PLLC

(57) ABSTRACT

A method utilizing available timing slack in the various timing paths of a synchronous integrated circuit to reduce the overall instantaneous current draw across the circuit. In the method, each timing path is analyzed to determine its late mode margin or its late mode margin and early mode margin. A delay is added to each timing path having a late mode margin greater than zero. Each delay effectively shifts the peak current draw for the corresponding timing path within each clock cycle so that the peaks do not occur simultaneously across all timing paths. In other embodiments, the peak overall instantaneous current draw can be further reduced by reducing the delay in some of the delayed timing paths.

5 Claims, 7 Drawing Sheets

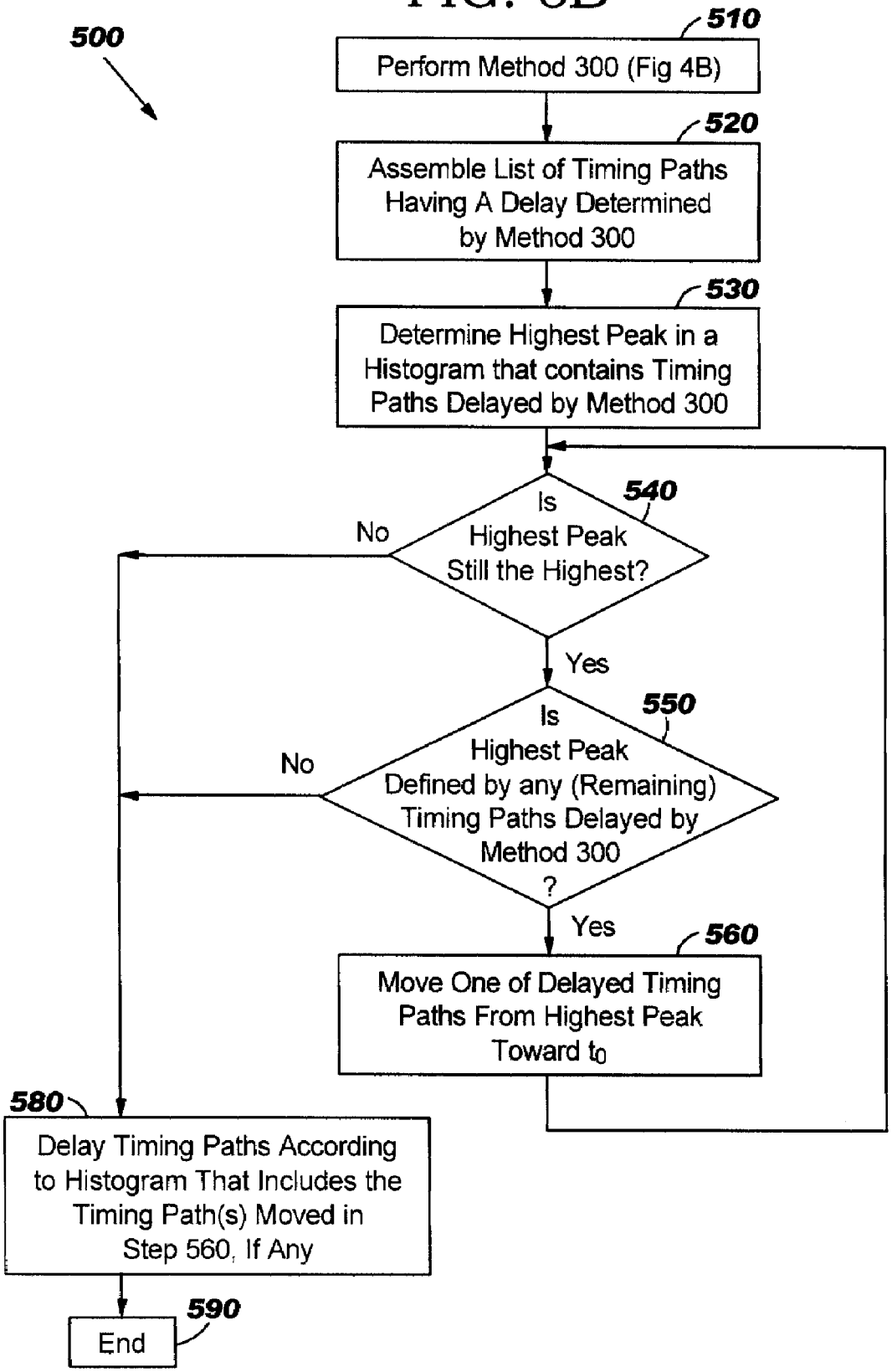

METHOD OF REDUCING INSTANTANEOUS CURRENT DRAW AND AN INTEGRATED CIRCUIT MADE THEREBY

BACKGROUND OF INVENTION

1. Field of the Invention

The present invention generally relates to the field of integrated circuits. In particular, the present invention is directed to a method of reducing instantaneous current draw and an integrated circuit made thereby.

2. Background of the Invention

As semiconductor chips are being designed and manufactured with increasing functionality requiring higher power at lower voltages, the current demand aboard these chips is becoming higher and higher. This is particularly true for synchronous designs. As shown in FIG. 1, every clock edge creates a large instantaneous current draw in each timing path due to the edge-triggered elements activating at essentially the same time as one another during each clock cycle. This is illustrated in FIGS. 1A and 1B, which show the profiles 20, 24 of instantaneous current drawn by two timing paths during one clock cycle. While these profiles may be different from one another due to the particular characteristics of the individual paths and the elements triggered, it is seen that the peaks 28, 32 of the instantaneous currents occur very close in time to one another near the beginning of the clock cycle.

Since these current draws are additive, as shown in FIG. 1C when peaks 28, 32 (FIGS. 1A and 1B) occur at the same time, or nearly so, the result is an overall current draw profile 36 having a peak value that is equal to the sum of the peak values of individual profiles, or nearly so. If peaks 28, 32 of current profiles 20, 24 have substantially the same value as one another and occur substantially at the same time, the magnitude of peak 40 of the summation of the two profiles is approximately twice the magnitude of each of the two peaks. FIGS. 1A–C illustrate the state of instantaneous current draw for only two timing paths, so the problem may not appear so dramatic. However, an actual chip includes many timing paths. As can be readily appreciated, when instantaneous current peaks are additive across all of the timing paths, the result is a large overall instantaneous current draw across the chip near the beginning of each clock cycle. The simultaneous switching occurring across multiple timing paths is generally known as "simultaneous switching noise" (SSN) and can be detrimental, e.g., to a power supply due to creation of a large voltage spike at peak current draw.

Approaches used to minimize the effect of SSN include adding power and ground contacts and wiring in order to provide a more robust power distribution system, as well as adding on-chip capacitance. However, as voltages continue to decrease on future technologies, these solutions become more costly due to the valuable silicon area required for their implementation and/or increased packaging costs. Asynchronous circuit design could be used to minimize SSN. However, asynchronous design is not well supported from a design tool perspective. What is needed is a solution to SSN that has minimal impact on silicon area and that is well supported by conventional synchronous design tools.

SUMMARY OF INVENTION

In one aspect, the present invention is directed to a method of reducing the magnitude of an overall instantaneous current draw during a timing cycle in a synchronous integrated circuit comprising a plurality of timing paths. The method comprises the step of determining for each one of the plurality of timing paths a corresponding delay. A delay element is inserted into each one of the plurality of timing paths having the corresponding delay. The delay element is configured to induce the corresponding delay into that one of the plurality of timing paths.

In another aspect, the present invention is directed to an integrated circuit comprising a plurality of timing paths each having a late mode margin. A delay element is located in each one of at least some of the plurality of timing paths. Each of the delay elements has a delay that is a function of the late mode margin of the corresponding one of the plurality of timing paths.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 6B is a flow diagram illustrating a fourth method of the present invention for reducing the overall instantaneous current draw during each clock cycle.

DETAILED DESCRIPTION

Figure 1A:
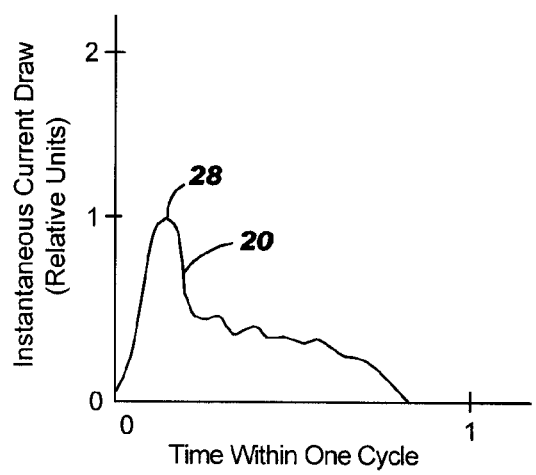
FIG. 1A is an instantaneous current draw profile for a first timing path.
Figure 1B:
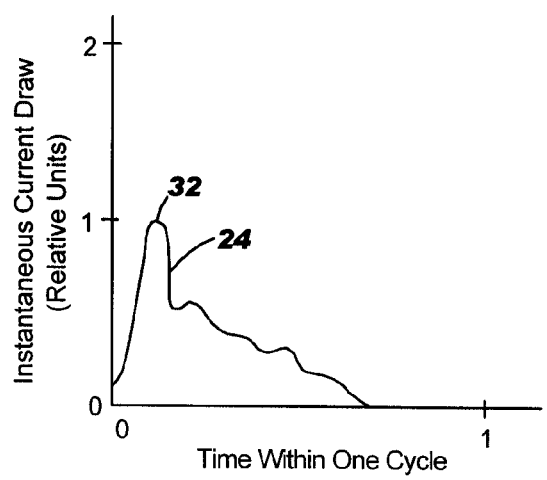
FIG. 1B is an instantaneous current draw profile for a second timing path and FIG. 1C is an overall instantaneous current draw profile for the first and second timing paths.
Figure 2:
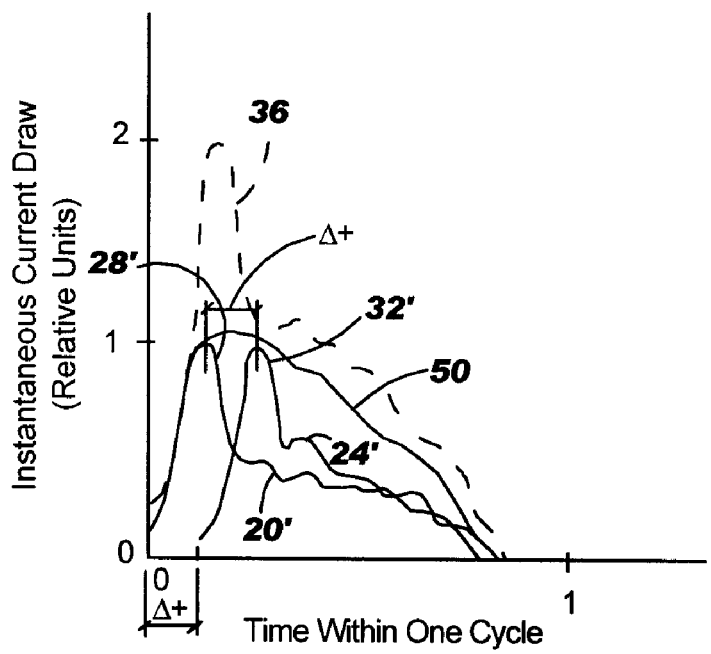
FIG. 2 is a graph illustrating an overall instantaneous current draw profile for two individual instantaneous current draw profiles of two timing paths.

As discussed in the background section above, a very high overall instantaneous current draw results from the additive nature of current draws across a plurality of timing paths, particularly when the individual current draws peak at nearly the same time during a clock cycle. A solution to this problem is to delay the occurrence of some of these peaks relative to others of these peaks so that not all of the peaks of the individual current draw profiles are additive with one another. This solution is illustrated in FIG. 2, wherein the individual instantaneous current draw profiles 20, 24' are the same as shown in FIG. 1A, with the exception that current draw profile 24' is delayed, or shifted, by a time, Δt relative to time it would have occurred without the delay. In the example of FIGS. 1A and 1B, the highest peaks 28, 32 were assumed to occur at the same time, so that in FIG. 2, Δt may also be measured relative to peaks 28', 32' of current draw profiles 20', 24', respectively.

Figure 1C:
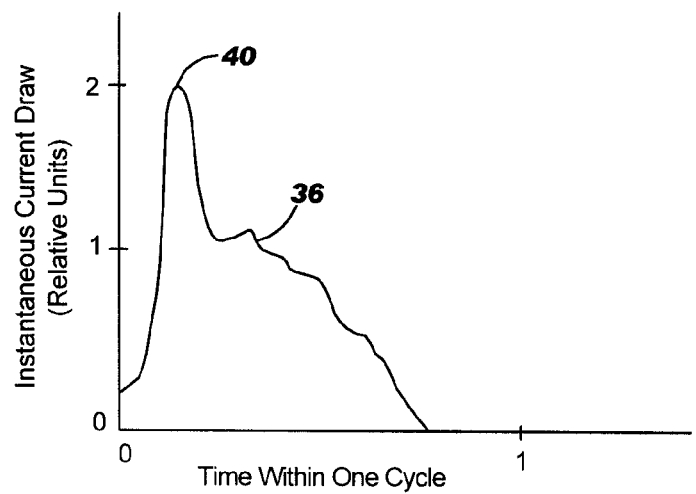

From FIG. 2, it is readily seen that when current draw profiles 20', 24' are added together, the peak value of the overall current draw profile 50 is almost one-half of the peak value of the overall current draw profile 36 of FIG. 1C that is reproduced in FIG. 2 for convenience. Similar to FIG. 1, FIG. 2 illustrates the general concept of the present invention relative to only two current draw profiles 20', 24' for convenience. As those skilled in the art will readily appreciate, the number of individual current draw profiles for an actual integrated circuit will be much greater than the two shown. However, the concept of delaying the clock signals in some of the timing paths relative to others, if possible, is essentially the same as for the two clock example of FIG. 2, only more involved due to the number of timing paths involved. The present invention includes methods for systematically determining the Δt for each timing path, if any, and integrated circuits designed in accordance with these methods.

Figure 3A:
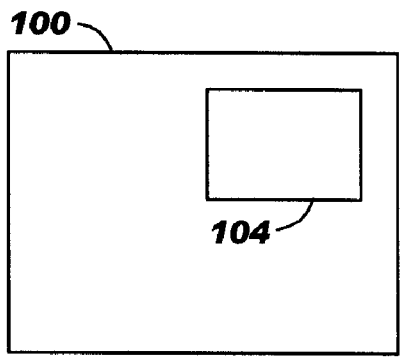
FIG. 3A is a high-level schematic diagram of an integrated circuit chip of the present invention.

FIG. 3A shows in accordance with the present invention an integrated circuit (IC) chip, which is generally denoted by the numeral 100. Chip 100 may be any type of IC chip such as an application-specific IC (ASIC), microprocessor or system-on-chip, among others. Chip 100 may provide any one or more functions needed to suit a particular design. Those skilled in the art will readily appreciate that the particular function(s) that chip 100 provides is/are not material to the understanding of the present invention. Therefore, these functions are not described herein. Chip 100 includes at least one synchronous circuit 104.

Figure 3B:
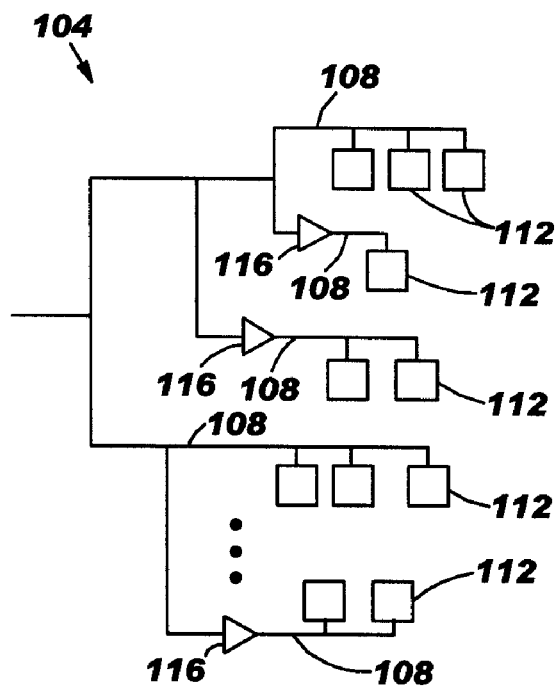
FIG. 3B is a partial schematic diagram of timing and functional circuitry of the integrated circuit chip of FIG. 3A.
Figure 5A:
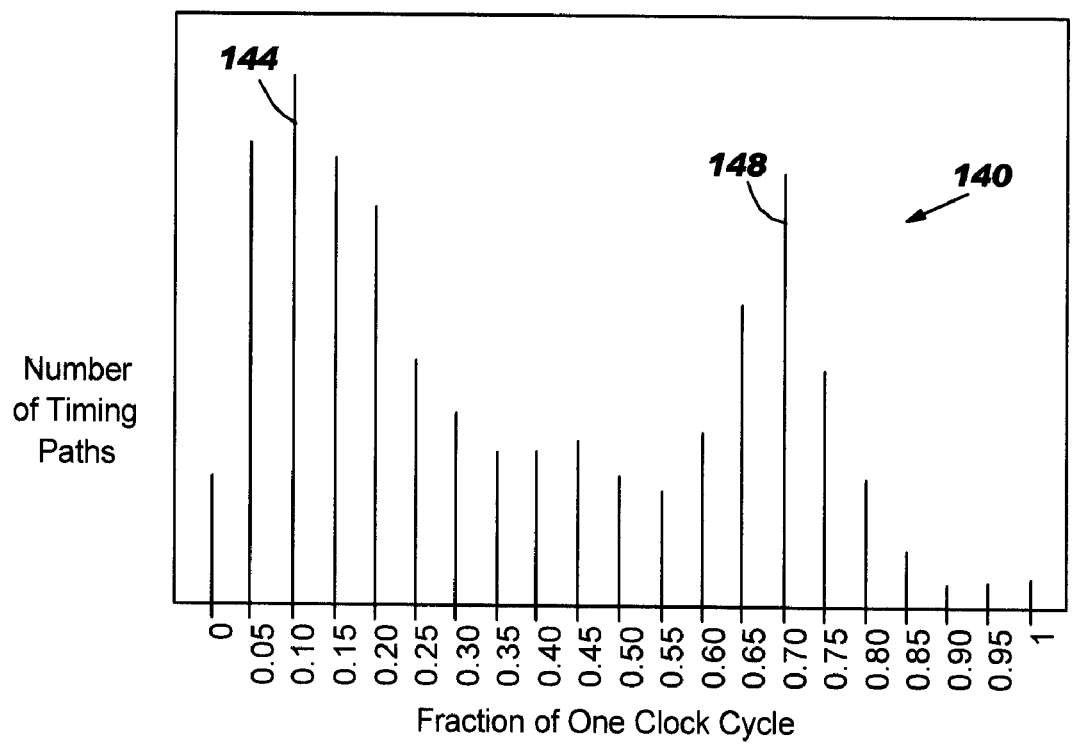
FIG. 5A is a histogram of timing paths versus the fraction of a clock cycle showing the number of timing paths having a peak instantaneous current draw at each of a plurality of fractions of the clock cycle.

As shown in FIG. 3B, synchronous circuit 104 generally includes a plurality of timing paths 108, each in electrical communication with one or more functional elements 112, such as latches and logic gates, among others, that are triggered during each clock cycle. As will become apparent from the disclosure below, some of timing paths 108 may each include a delay element 116 for causing a clock signal propagating through that timing path to be delayed by a predetermined fraction of a clock cycle. Each delay element 116 causes a corresponding delay determined according to the methodology of the present invention so as to reduce the magnitude of the highest peak 40 of overall instantaneous current draw profile 36 (FIGS. 1C and 2) across all of timing paths 108 driven that would have occurred without the delay elements. In this connection FIG. 5A shows an illustrative histogram 140 that represents all timing paths 108 under consideration with respect to the methodology of the present invention prior to applying this methodology. As can be seen in FIG. 5A, a relatively large peak 144 occurs at about one-tenth of the cycle and a smaller peak 148 occurs at about seven-tenths of the cycle. The methodology of the present invention, described below, can be utilized to reduce the magnitudes of peaks 144, 148 and further smooth the overall instantaneous current draw.

Generally, the methods of the present invention described below utilize available timing slack (also know as "late mode margin"), if any, in each of timing paths to delay the timing signal in that path so as to move, or shift, the peak of that timing path's instantaneous current profile in order to lower the peak of the overall instantaneous current profile, as discussed above in connection with FIG. 2. In other words, a goal of the invention is to delay the triggering clock edge along the non-timing-critical paths during each clock cycle until some time greater than the start of that clock cycle ($t_0$), such that the overall instantaneous current draw profile is smoothed over the clock cycle, thereby reducing the peak value of the overall instantaneous current draw.

Although various timing paths may have late mode margins available for delaying the corresponding timing signals, each of these timing paths may also have an "early mode margin" that effectively limits the amount of that path's late mode margin that may be "used" to delay the timing signal through that path. Generally, an early mode margin is the period between the time an element must be triggered in order to contain a valid data bit and the time the element is actually triggered at some time later than the time the element should have been triggered. Early mode margin is caused by delay within the timing path to the affected element(s) and results in improper functioning of the circuit. Late and early mode margins can be determined for each timing path using a static timing tool well-known in the industry, e.g., the Synopsis Primetime static timing tool used by International Business Machines, Armonk, N.Y.

Figure 4A:
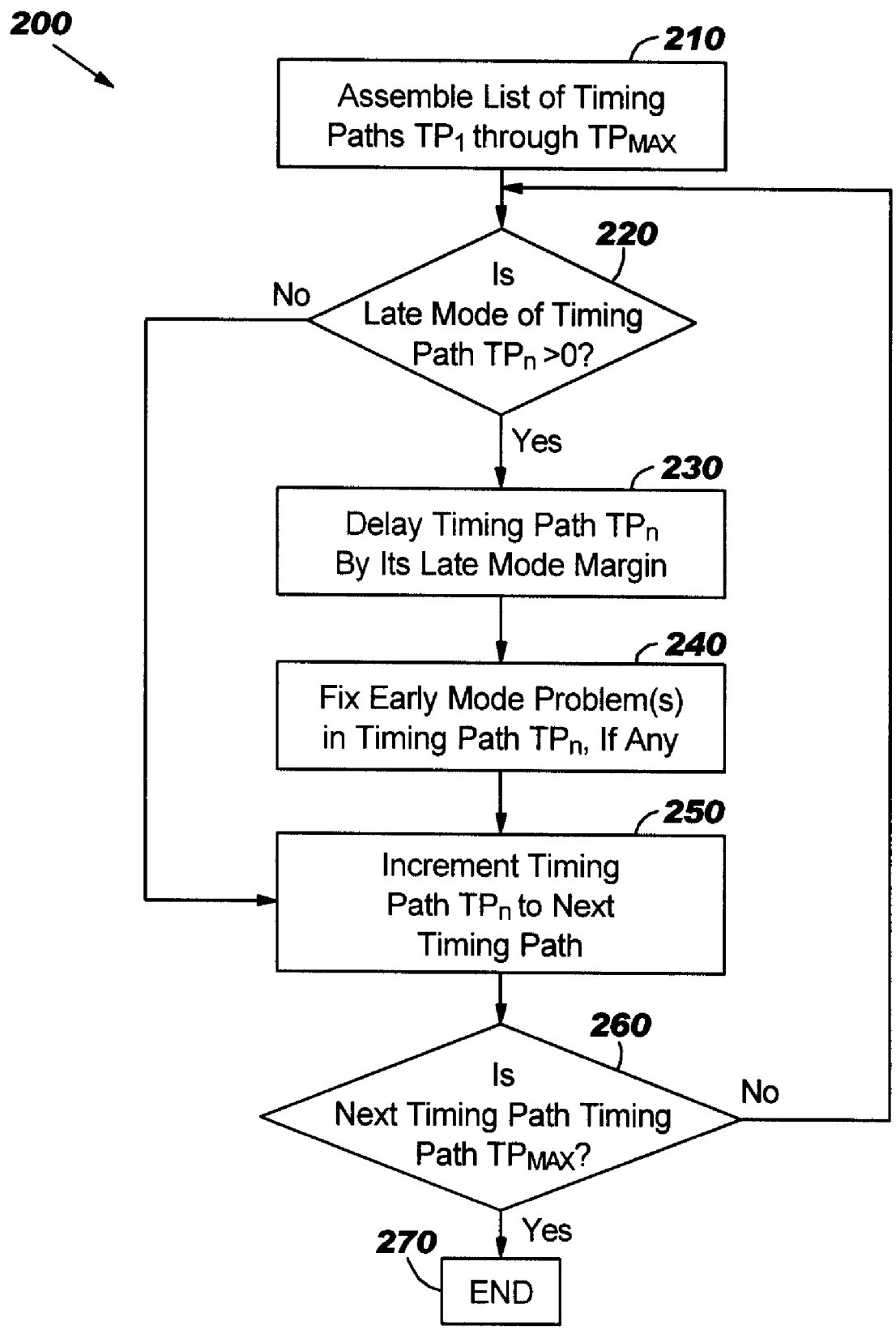
FIG. 4A is a flow diagram illustrating a method of the present invention for reducing the overall instantaneous current draw during each clock cycle.
Figure 4B:
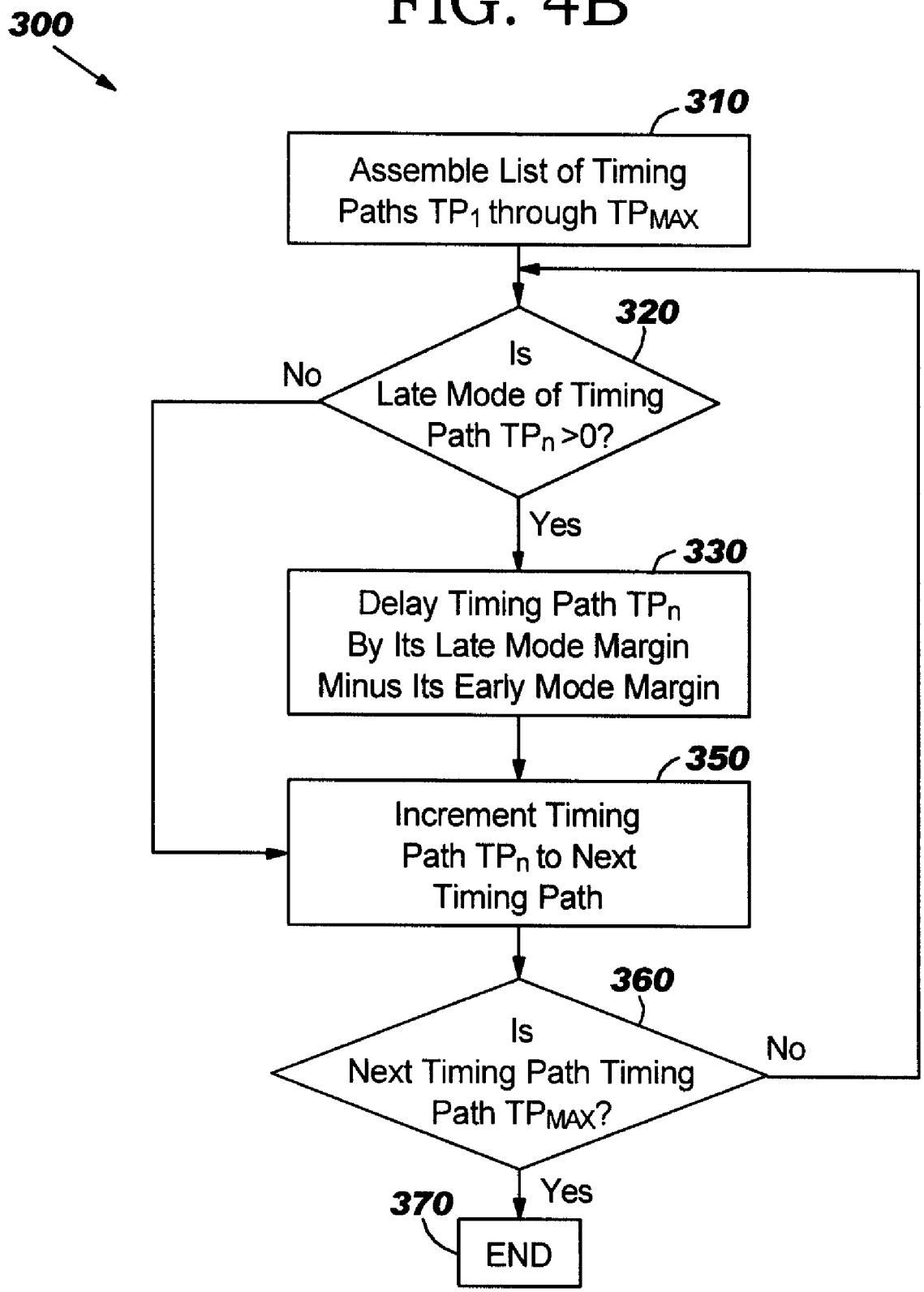
FIG. 4B is a flow diagram illustrating a second method of the present invention for reducing the overall instantaneous current draw during each clock cycle.

FIGS. 4A and 4B each show a method 200, 300 according to the present invention for determining the amount of delay, if any, for each timing path. If either method 200, 300 determines that a timing path can have a delay, a delay element 116 (FIG. 3A) is designed to impart the delay into that timing path in order to effect a reduction in the peak of the overall instantaneous current draw profile. Accordingly, each of these methods 200, 300 describes an approach for minimizing the peak value of overall instantaneous current draw across all timing paths. Generally, method 200 of FIG. 4A is a "coarse" approach, whereas method 300 of FIG. 4B is generally a more refined approach.

Referring to FIG. 4A, at step 210 of method 200 a list is assembled of all timing paths, i.e., timing paths $TP_1$ through $TP_{MAX}$ of the IC, or portion thereof, to which the method is to be applied. At step 220, the first timing path $TP_n$ (n=1) is evaluated to determine if its late mode margin is greater than zero. If the late mode margin of timing path $TP_n$ is greater than zero, at step 230, the timing signal for timing path $TP_n$ is delayed by a time equal to the late mode margin. As seen in FIG. 3B, the timing signal may be delayed by adding a delay element (116) for timing path $TP_n$ (108). Then at step 240, any early mode problems in timing path $TP_n$ are fixed. Those skilled in the art will readily understand how early mode problems may be fixed, such that it is not necessary to discuss step 240 in any detail in order for those skilled in the art to understand and practice the present invention. After early mode problems, if any, have been fixed, the method proceeds to steps 250 and 260, wherein it is determined whether or not additional timing paths $TP_n$ remain to be evaluated or all the timing paths have been evaluated. If $TP_{n+1}$ is less than $TP_{MAX}$, then the next timing path is evaluated at step 220. If $TP_{n+1}$ is equal to $TP_{MAX}$, then the method ends at step 270. If, however, at step 220, the late mode margin of the first timing path $TP_n$ (n=1) was zero, then no delay of the corresponding timing signal would be possible and the method would proceed directly to steps 250 and 260 to determine whether or not any more timing paths require evaluation.

As mentioned above, FIG. 4B illustrates a related, but refined, method 300 for determining timing signal delays. In method 200 of FIG. 4A, each timing signal is shifted by the late mode margin, if any, of the corresponding timing path (step 230), and then any early mode problems on that timing path are fixed (step 240). In contrast, in method 300 of FIG. 4B, step 240 (FIG. 4A) is eliminated by delaying each timing signal by the late mode margin of the corresponding timing path minus the early mode margin of that timing path. This is shown in step 330 of FIG. 4B. The remaining steps of method 300, i.e., steps 310, 320, 350, 360 and 370, may be the same as corresponding steps 210, 220, 250, 260 and 270 of method 200 of FIG. 4A, described above.

As discussed below in connection with FIGS. 6A and 6B, each of method 200, 300 of FIGS. 4A and 4B, respectively, may be used as a starting point for a corresponding smoothing method 400, 500 that reduces the variation of the overall current draw profile. Methods 400, 500 may be readily described with reference to a histogram, such as histogram 150 of FIG. 5B, that represents all of the timing paths evaluated by method 200 (FIG. 4A) or method 300 (FIG. 4B) relative to a single timing cycle, as determined by either method 200 or method 300. Methods 400, 500 of FIGS. 6A and 6B illustrate a smoothing function that may be used to further smooth the overall instantaneous current draw profile over all timing paths (i.e., $TP_1$ through $TP_{MAX}$). Generally, each method 400, 500 identifies peaks within a histogram, e.g., histogram 144, resulting from either method 200 or method 300 and then reduces the delay determined in that method by an amount less than originally determined if the reduced delay would further assist smoothing the overall instantaneous current draw profile. Histogram 150 may be generated by adding up all of the current signatures, offset by their switching time, of the various circuits and circuit elements under consideration with respect to methods 400, 500.

Smoothing the overall instantaneous current draw profile represented by histogram 150 essentially involves moving timing paths from the highest peak(s), e.g., peak 152, of the histogram to lower points on the histogram by reducing the delay in one or more timing paths that define the highest peak(s). Of course, those skilled in the art will readily appreciate that it is not necessary to actually generate a histogram after performing either of methods 200, 300 in order to implement either. Rather, methods 400, 500 may be performed with appropriate purely mathematical algorithms.

Figure 5B:
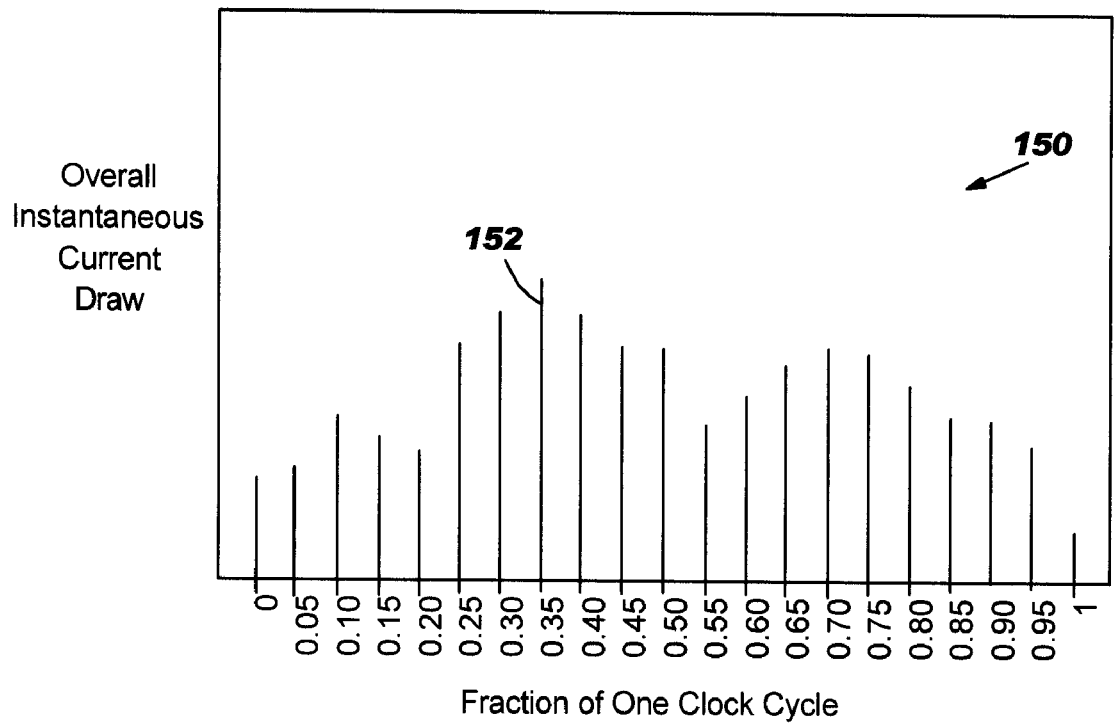
FIG. 5B is a histogram of overall instantaneous current draw during a clock cycle after performing either the method of FIG. 4A or the method of FIG. 4B.
Figure 6A:
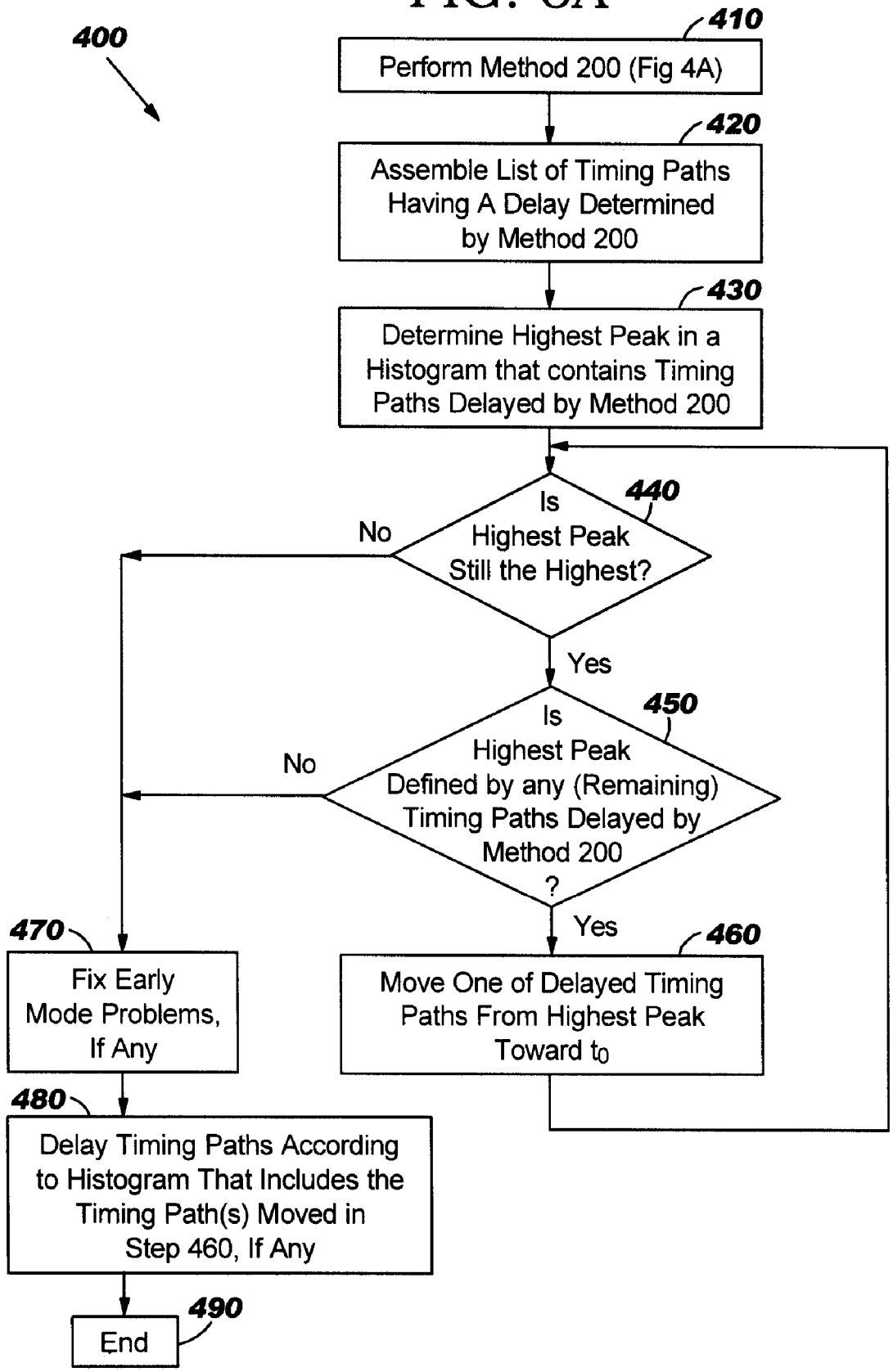
FIG. 6A is a flow diagram illustrating a third method of the present invention for reducing the overall instantaneous current draw during each clock cycle.

Referring to FIGS. 6A and 5B, method 400 begins at step 410 by performing method 200 of FIG. 4A. However, at this point, delay elements 116 (FIG. 3B) are not yet selected. Then at step 420, a list is assembled of all timing paths having a timing delay determined in method 200. At step 430, the highest peak within a histogram, i.e., the time within the timing cycle containing the most timing paths, is determined. At step 440, it is determined whether the highest peak is higher than any other peak. Then, at step 450 it is determined whether any of the timing paths making up the highest peak are within the list of delayed timing paths assembled in step 420. If so, at step 460, one of such timing paths is moved from the highest peak toward time $t_0$ to, e.g., the fraction of the cycle having the fewest timing paths. As those skilled in the art will appreciate that, because the timing paths were moved in method by their late mode margins, timing paths can be moved only in a direction toward $t_0$, thereby reducing the originally-determined delay.

Once a timing path has been moved, steps 440, 450 and 460 of determining if the highest peak is still the highest, determining whether any of the timing paths making up the highest peak are in the list of delayed paths and moving a listed path to a lower time fraction are repeated in sequence until the highest peak is no longer higher than an originally second highest peak. If none of the timing paths making up the highest peak were determined in method 200 to be delayable at step 450, then method 400 proceeds to steps 470, 470 and 490 because the peak cannot be reduced at step 460. At step 470, any early mode problems are fixed, at step 480 delay elements (116, FIG. 3B) are added to timing paths (108) and at step 490 method 400 ends. Similarly, when the highest peak, is no longer the highest peak method 400 proceeds to steps 470, 480 and 490. Those skilled in the art will readily appreciate that method 400 can be easily expanded to reduce second-highest, third-highest, and so on, peaks to further smooth the overall instantaneous current draw profile.

FIG. 6B illustrates a method 500 of smoothing the overall instantaneous current draw profile that may be used in conjunction with method 300 of FIG. 4B, which is performed at step 510. Method 500 is similar to method 400 of FIG. 6A, except that at step 510 method 500 begins with performing method 300 of FIG. 4B rather than method 200 of FIG. 4A and that step 470 of method 400 (FIG. 6A) is eliminated because early mode problems are handled by subtracting the early mode margin from the late mode margin in step 330 of method 300 (FIG. 4B). Otherwise steps 510, 520, 530, 540, 550, 560, 580 and 590 of method 500 are essentially the same as the corresponding steps 410, 420, 430, 440, 450, 460, 480 and 490 of method 400 of FIG. 6A. As those skilled in the art will understand, method 500 requires special instantaneous current rules for each circuit, e.g., circuit 104 (FIG. 3), to be evaluated. These rules are used to add up the worst-case instantaneous currents during a clock cycle.

Of course, those skilled in the art will appreciate that methods 400, 500 described above illustrate only two ways in which the overall instantaneous current draw may be smoothed. Those skilled in the art will appreciate that other smoothing methods may be used and will understand how to devise such other methods such that it is not necessary to list and describe such alternatives herein.

While the present invention has been described in connection with a preferred embodiment, it will be understood that it is not so limited. On the contrary, it is intended to cover all alternatives, modifications and equivalents as may be included within the spirit and scope of the invention as defined above and in the claims appended hereto.

The invention claimed is:

1. A method of reducing the magnitude of an overall instantaneous current draw during a timing cycle in a synchronous integrated circuit having a plurality of timing paths each having a late mode margin associated therewith, comprising the steps of:
   (a) stepping through the plurality of timing paths so as to determine for each one of the plurality of timing paths whether or not the corresponding late mode margin is greater than zero;
   (b) in response to the corresponding late mode margin being determined to be greater than zero in step (a), adding a delay to the corresponding one of said plurality of timing paths; and
   (c) in response to the corresponding late mode margin being determined to be greater than zero in step (a), inserting a delay element into the corresponding one of the plurality of timing paths, said delay element configured to induce said delay into the corresponding one of the plurality of timing paths;
   wherein each one of the plurality of timing paths has a corresponding late mode margin and step (b) includes setting said delay to said corresponding late mode margin minus a fraction of a timing cycle.

2. The method according to claim 1, wherein at least some of the plurality of timing paths each have early mode problems, the method further comprising, prior to step (c), the step of fixing said early mode problems.

3. A method of reducing the magnitude of an overall instantaneous current draw during a timing cycle in a synchronous integrated circuit having a plurality of timing paths each having a late mode margin associated therewith, comprising the steps of:
   (a) stepping through the plurality of timing paths so as to determine for each one of the plurality of timing paths whether or not the corresponding late mode margin is greater than zero;
   (b) in response to the corresponding late mode margin being determined to be greater than zero in step (a), adding a delay to the corresponding one of said plurality of timing paths; and
   (c) in response to the corresponding late mode margin being determined to be greater than zero in step (a), inserting a delay element into the corresponding one of the plurality of timing paths, said delay element configured to induce said delay into the corresponding one of the plurality of timing path;
   wherein each one of the plurality of timing paths has a corresponding early mode margin and step (b) includes setting each delay to said corresponding late mode margin minus said corresponding early mode margin.

4. The method according to claim 3, wherein the overall instantaneous current draw has a profile having a peak defined by a portion of the plurality of timing paths, the method further comprising the step of removing at least one timing path from said portion of the plurality of timing paths.

5. The method according to claim 4, wherein at least some of the plurality of timing paths each have at least one early mode problem, the method further comprising, prior to step (c), the step of fixing said early mode problems.

* * * * *